US 11,887,694 B2

(12) United States Patent
Kwon

(10) Patent No.: US 11,887,694 B2
(45) Date of Patent: Jan. 30, 2024

(54) MEMORY DEVICE AND OPERATING METHOD OF THE MEMORY DEVICE

(71) Applicant: SK hynix Inc., Icheon-si (KR)

(72) Inventor: Tae Heui Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 202 days.

(21) Appl. No.: 17/577,140

(22) Filed: Jan. 17, 2022

(65) Prior Publication Data
US 2023/0022286 A1 Jan. 26, 2023

(30) Foreign Application Priority Data
Jul. 20, 2021 (KR) ......................... 10-2021-0095097

(51) Int. Cl.
*G11C 16/16* (2006.01)
*G11C 16/08* (2006.01)
*G11C 8/08* (2006.01)
*G11C 8/12* (2006.01)
*G11C 8/10* (2006.01)

(52) U.S. Cl.
CPC .................. *G11C 8/08* (2013.01); *G11C 8/10* (2013.01); *G11C 8/12* (2013.01)

(58) Field of Classification Search
CPC .... G11C 8/08; G11C 8/10; G11C 8/12; G11C 16/30; G11C 16/0483; G11C 16/16; G11C 16/32; G11C 16/08; G11C 7/1048; G11C 16/14
See application file for complete search history.

(56) References Cited

U.S. PATENT DOCUMENTS

| 11,120,876 | B2 * | 9/2021 | Kwon | .................... G11C 16/24 |
| 2005/0111282 | A1 * | 5/2005 | Dono | ................... G11C 29/783 |
| | | | | 365/222 |
| 2013/0051152 | A1 * | 2/2013 | Lee | ..................... G11C 16/3418 |
| | | | | 365/185.18 |
| 2019/0019562 | A1 * | 1/2019 | Kim | ................... G11C 16/3459 |
| 2021/0233588 | A1 * | 7/2021 | Kwon | .................... G11C 16/08 |

FOREIGN PATENT DOCUMENTS

KR 1020190002369 A 1/2019

* cited by examiner

*Primary Examiner* — Hien N Nguyen
(74) *Attorney, Agent, or Firm* — William Park & Associates Ltd.

(57) ABSTRACT

A memory device includes a memory block and a peripheral circuit. The memory block includes a first word line group of word lines included in the memory block and a second word line group of the word lines included in the memory block. The word lines of the first word line group are different from the word lines of the second word line group. The peripheral circuit provides the first word line group and the second word line group with an equalizing voltage during an equalizing section overlapping an erase voltage discharging section for the memory block to constantly keep voltages of the first word line group and the second word line group to the equalizing voltage.

20 Claims, 6 Drawing Sheets

MEMORY DEVICE AND OPERATING METHOD OF THE MEMORY DEVICE

CROSS-REFERENCES TO RELATED APPLICATION

The present application claims priority under 35 U.S.C. § 119(a) to Korean application number 10-2021-0095097, filed on Jul. 20, 2021, in the Korean Intellectual Property Office, which is incorporated herein by reference in its entirety as set forth in full.

BACKGROUND

1. Technical Field

Various embodiments generally relate to a memory device, and, more particularly, to a nonvolatile memory device.

2. Related Art

An electronic device includes a lot of electronic elements, and a computer system may include a lot of electronic elements each configured by a semiconductor. Among semiconductor apparatuses configuring a computer system, a host such as a process or a memory controller may perform data communication with a memory device. The memory device may store data into a plurality of memory cells each specified by a word line and a bit line.

Some memory device among various memory devices, for example, a NAND flash memory does not support an overwrite operation and may perform an erase operation to secure an empty memory region. For example, the memory device may perform an erase operation in units of memory blocks.

SUMMARY

In an embodiment, a memory device may include a memory block and a peripheral circuit. The memory block may include a first word line group of word lines included in the memory block and a second word line group of the word lines included in the memory block. The word lines of the first word line group may be different from the word lines of the second word line group. The peripheral circuit may be configured to provide the first word line group and the second word line group with an equalizing voltage during an equalizing section overlapping an erase voltage discharging section for the memory block to constantly keep voltages of the first word line group and the second word line group to the equalizing voltage.

In an embodiment, a memory device may include a memory block and a peripheral circuit. The memory block may include a first word line group of word lines included in the memory block and a second word line group of the word lines included in the memory block. The word lines of the first word line group may be different from the word lines of the second word line group. The peripheral circuit may be configured to provide, during an erase operation on the memory block, the first word line group and the second word line group respectively with a first word line voltage and a second word line voltage and then constantly provide an equalizing voltage during an equalizing section.

In an embodiment, an operating method of a memory device may include providing, during an erasing section, a first word line group of a memory block with a first word line voltage and a second word line group of the memory block with a second word line voltage, which is higher than the first word line voltage; providing, during an equalizing section after the erasing section, the first word line group and the second word line group with an equalizing voltage, which is higher than the second word line voltage; and discharging, during an erase voltage discharging section included in the equalizing section, an erase voltage during the providing of the equalizing voltage.

In an embodiment, a memory device may include a memory block and a peripheral circuit. The memory block may include a first word line group of word lines included in the memory block and a second word line group of the word lines included in the memory block. The word lines of the first word line group may be different from the word lines of the second word line group. The peripheral circuit may be configured to provide the first word line group and the second word line group with an equalizing voltage during an equalizing section overlapping an erase voltage discharging section for the memory block to cause substantially uniform negative boosting to occur with the first word line group and the second word line group during the erase voltage discharging section.

DETAILED DESCRIPTION

Embodiments of the present disclosure will be described below in more detail with reference to the accompanying drawings. The present disclosure may, however, be embodied in different forms and should not be construed as limited to the embodiments set forth herein.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, embodiments of the present disclosure will be described below with reference to the accompanying drawings.

According to an embodiment, provided may be a memory device capable of guaranteeing reliability thereof by controlling an effect of negative boosting to evenly occur during an erase operation, and an operating method of the memory device.

Figure 1:
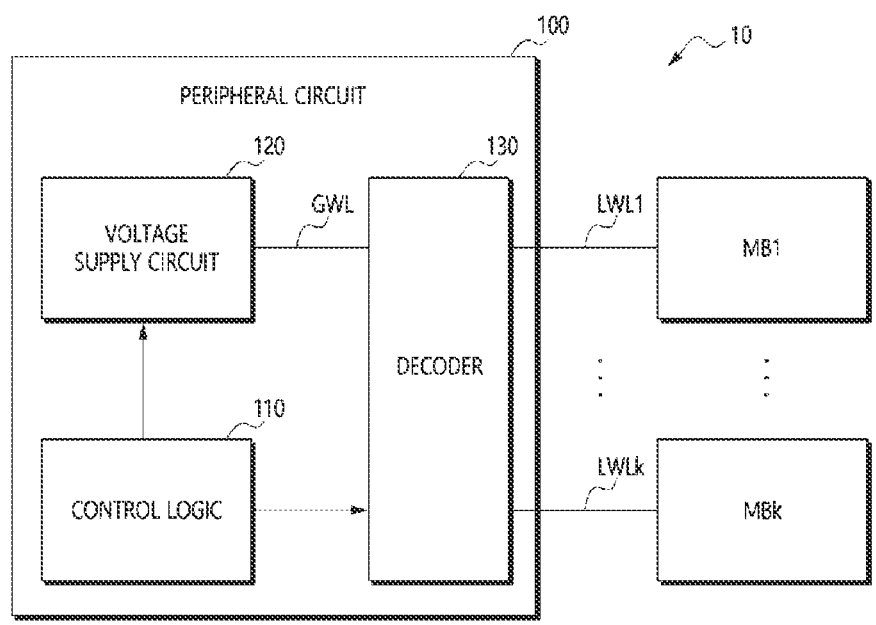
FIG. 1 is a block diagram illustrating a memory device according to an embodiment.

FIG. 1 is a block diagram illustrating a memory device 10 according to an embodiment.

Referring to FIG. 1, the memory device 10 may include a peripheral circuit 100 and memory blocks MB1 to MBk. The memory blocks MB1 to MBk may be coupled to the peripheral circuit 100 respectively through word lines LWL1 to LWLk.

The peripheral circuit 100 may perform an erase operation on a target memory block among the memory blocks MB1 to MBk. While performing the erase operation, the peripheral circuit 100 may provide a plurality of different word line voltages respectively to a plurality of word line groups coupled to the target memory block during an erasing section. Word lines coupled to the target memory block may be grouped, according to a characteristic of a plug critical dimension (CD), to define the plurality of word line groups. During an equalizing section overlapping an erase voltage discharging section, the peripheral circuit 100 may constantly provide the plurality of word line groups with an equalizing voltage. The equalizing voltage may be higher than the plurality of word line voltages, which are provided to the plurality of word line groups during the equalizing section. The equalizing section may include at least one section, during which the equalizing voltage is provided, the at least one section being disposed immediately before, immediately after, or immediately before and after the erase voltage discharging section. The peripheral circuit 100 may discharge the plurality of word line groups during a word line discharging section immediately after the equalizing section.

The peripheral circuit 100 may include control logic 110, a voltage supply circuit 120 and a decoder 130. The control logic 110 may be implemented as hardware, software, or a combination of hardware and software. For example, the control logic 110 may be a control logic circuit operating in accordance with an algorithm and/or a processor executing control logic code.

The control logic 110 may control an overall operation of the memory device 10. For example, the control logic 110 may control the voltage supply circuit 120 and the decoder 130 to perform an erase operation.

Under the control of the control logic 110, the voltage supply circuit 120 may provide each unit within the memory device 10 with a voltage that is pre-set according to an operation. For example, the voltage supply circuit 120 may provide global word lines GWL with the plurality of word line voltages and the equalizing voltage under the control of the control logic 110 during an erase operation.

Under the control of the control logic 110, the decoder 130 may address a target memory block, on which an internal operation is to be performed among the memory blocks MB1 to MBk. For example, during an erase operation, the decoder 130 may select a target memory block among the memory blocks MB1 to MBk based on an address provided from an external and may couple word lines of the target memory block to the global word lines GWL.

The memory device 10 may be a nonvolatile memory device. A nonvolatile memory device may include a flash memory device (e.g., the NAND Flash or the NOR Flash), the Ferroelectrics Random Access Memory (FeRAM), the Phase-Change Random Access Memory (PCRAM), the Magnetic Random Access Memory (MRAM), the Resistive Random Access Memory (ReRAM) and so forth.

According to an embodiment, the peripheral circuit 100 may provide word lines, which are coupled to the target memory block, with the equalizing voltage constantly during the equalizing section overlapping the erase voltage discharging section. Therefore, uniform may be an effect of negative boosting, which occurs on the word lines coupled to the target memory block. Accordingly, the characteristics of memory cells may be controlled uniformly and data reliability may be secured.

Figure 2:
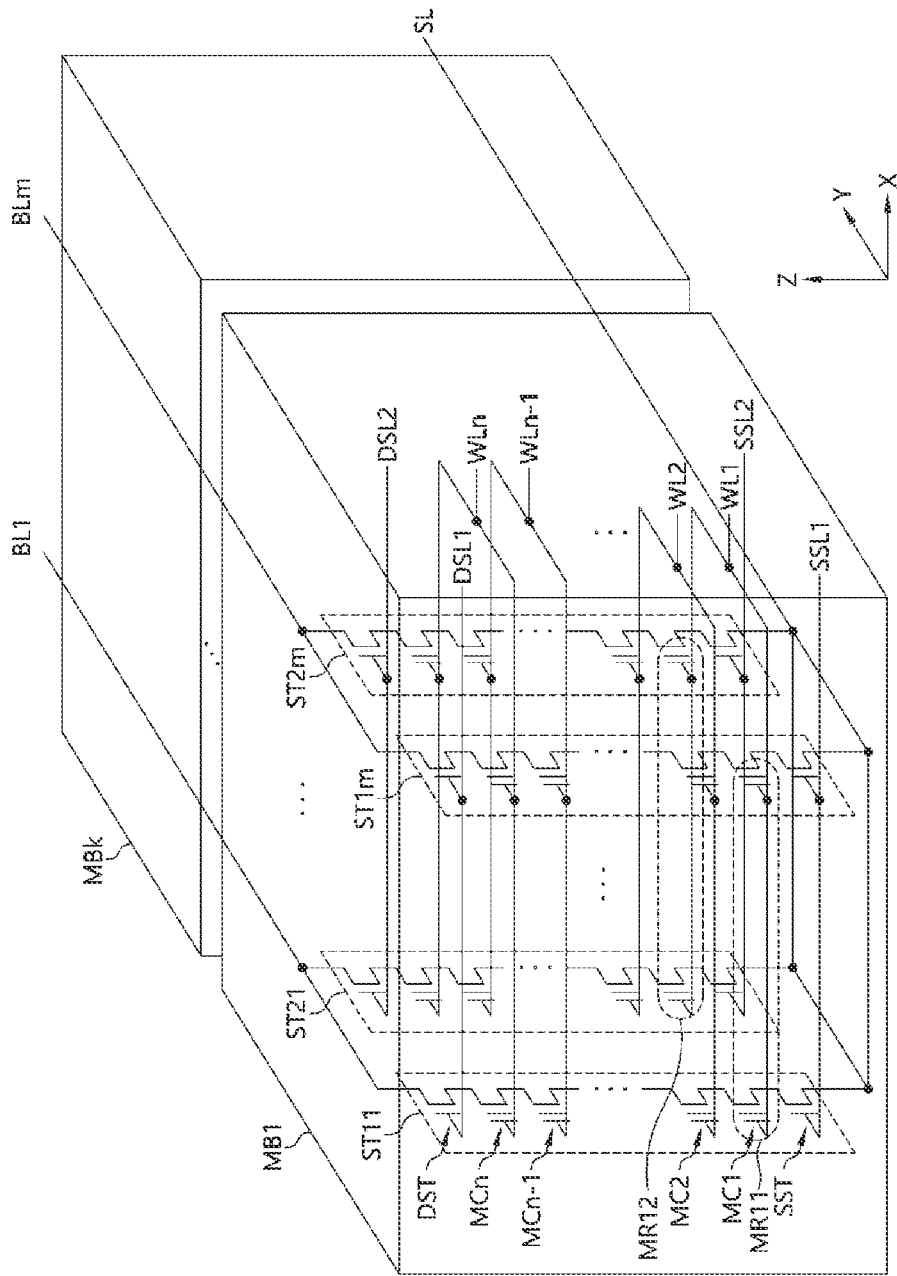
FIG. 2 is a circuit diagram illustrating a memory block according to an embodiment.

FIG. 2 is a circuit diagram illustrating a memory block MB1 according to an embodiment. Each of other memory blocks of FIG. 1 may be configured in a similar way to the memory block MB1 of FIG. 2.

Referring to FIG. 2, the memory block MB1 may include a plurality of strings ST11 to ST1$m$ and ST21 to ST2$m$. Each of the strings ST11 to ST1$m$ and ST21 to ST2$m$ may extend along with a vertical direction or a Z direction. Within the memory block MB1, 'm' number of strings may be arranged along with a row direction or a X direction. FIG. 2 illustrates two strings arranged along with a column direction or a Y direction, which is merely for convenience of description. Three strings or more may be arranged along with the column direction or the Y direction.

The strings ST11 to ST1$m$ and ST21 to ST2$m$ may be configured in the same way as one another. For example, the string ST11 may include a source select transistor SST, memory cells MC1 to MCn and a drain select transistor DST, which are serially coupled between a source line SL and a bit line BL1. A source of the source select transistor SST may be coupled to the source line SL. A drain of the drain select transistor DST may be coupled to the bit line BL1. The memory cells MC1 to MCn may be serially coupled between the source select transistor SST and the drain select transistor DST.

Gates of source select transistors of strings arranged in the same row may be coupled to the same source select line. For example, gates of source select transistors of the strings ST11 to ST1$m$ of the first row may be coupled to the source select line SSL1. For example, gates of source select transistors of the strings ST21 to ST2$m$ of the second row may be coupled to the source select line SSL2. In an embodiment, source select transistors of the strings ST11 to ST1$m$ and ST21 to ST2$m$ may be commonly coupled to a single source select line.

Gates of drain select transistors of strings arranged in the same row may be coupled to the same drain select line. For example, gates of drain select transistors of the strings ST11 to ST1$m$ of the first row may be coupled to the drain select line DSL1. For example, gates of drain select transistors of the strings ST21 to ST2$m$ of the second row may be coupled to the drain select line DSL2.

Strings arranged in the same column may be coupled to the same bit line. For example, the strings ST11 and ST21 of the first column may be coupled to the bit line BL1. For example, the strings ST1$m$ and ST2$m$ of the m-th column may be coupled to the bit line BL$m$.

Gates of memory cells arranged in the same location in the vertical direction may be coupled to the same word line. For example, among the memory cells of the strings ST11 to ST1$m$ and ST21 to ST2$m$, memory cells arranged in the same location as the memory cell MC1 may be coupled to a word line WL1. Word lines WL1 to WLn may correspond to the word line LWL1 of FIG. 1.

Among the memory cells of the strings ST11 to ST1m and ST21 to ST2m, memory cells coupled to the same word line at the same row may configure a single memory region. For example, memory cells coupled to the word line WL1 at the first row may configure a memory region MR11. For example, memory cells coupled to the word line WL1 at the second row may configure a memory region MR12. According to a number of the rows, each word line may be coupled to a plurality of memory regions. Memory cells configuring a single memory region may be programmed at the same time. For example, a single memory region may configure a page.

In an embodiment, the memory block MB1 may be further coupled to one or more dummy word lines as well as the word lines WL1 to WLn and may further include dummy memory cells coupled to the dummy word lines.

Figure 3:
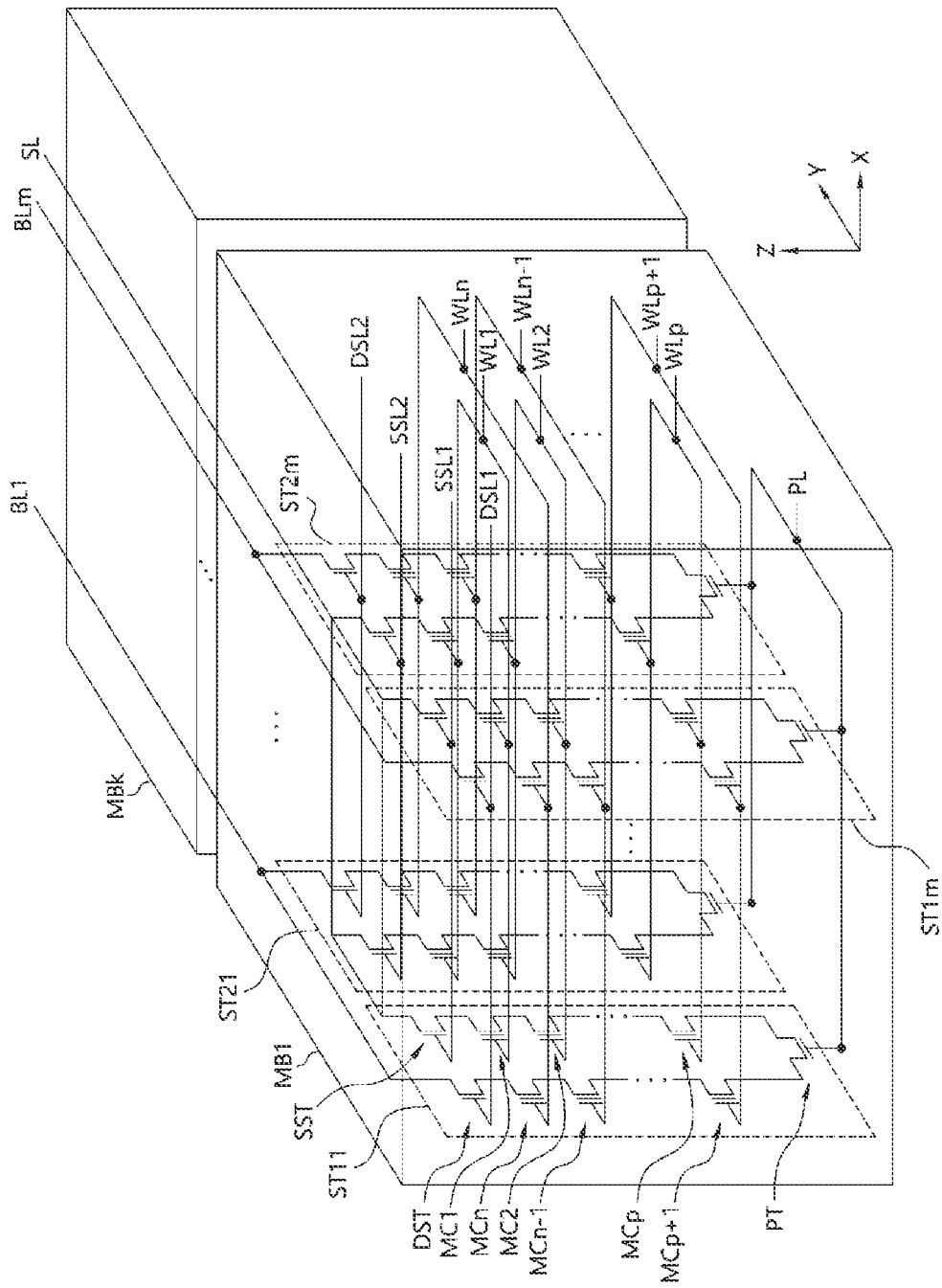
FIG. 3 is a circuit diagram illustrating a memory block according to an embodiment.

FIG. 3 is a circuit diagram illustrating a memory block MB1 according to an embodiment. Each of other memory blocks of FIG. 1 may be configured in a similar way to the memory block MB1 of FIG. 3.

Referring to FIG. 3, the memory block MB1 may include a plurality of strings ST11 to ST1m and ST21 to ST2m. The strings ST11 to ST1m and ST21 to ST2m of FIG. 3 may be configured and operate in a similar way to the strings ST11 to ST1m and ST21 to ST2m of FIG. 2, respectively. Each of the strings ST11 to ST1m and ST21 to ST2m of FIG. 3 may be formed in "U" shape and may further include a pipe transistor PT. A gate of the pipe transistor PT may be coupled to a pipe line PL. Memory cells MC1 to MCp among the memory cells MC1 to MCn may be sequentially arranged in a reverse direction of the Z direction and may be serially coupled between the source select transistor SST and the pipe transistor PT. Memory cells MCp+1 to MCn among the memory cells MC1 to MCn may be sequentially arranged in the Z direction and may be serially coupled between the pipe transistor PT and the drain select transistor DST.

Figure 4:
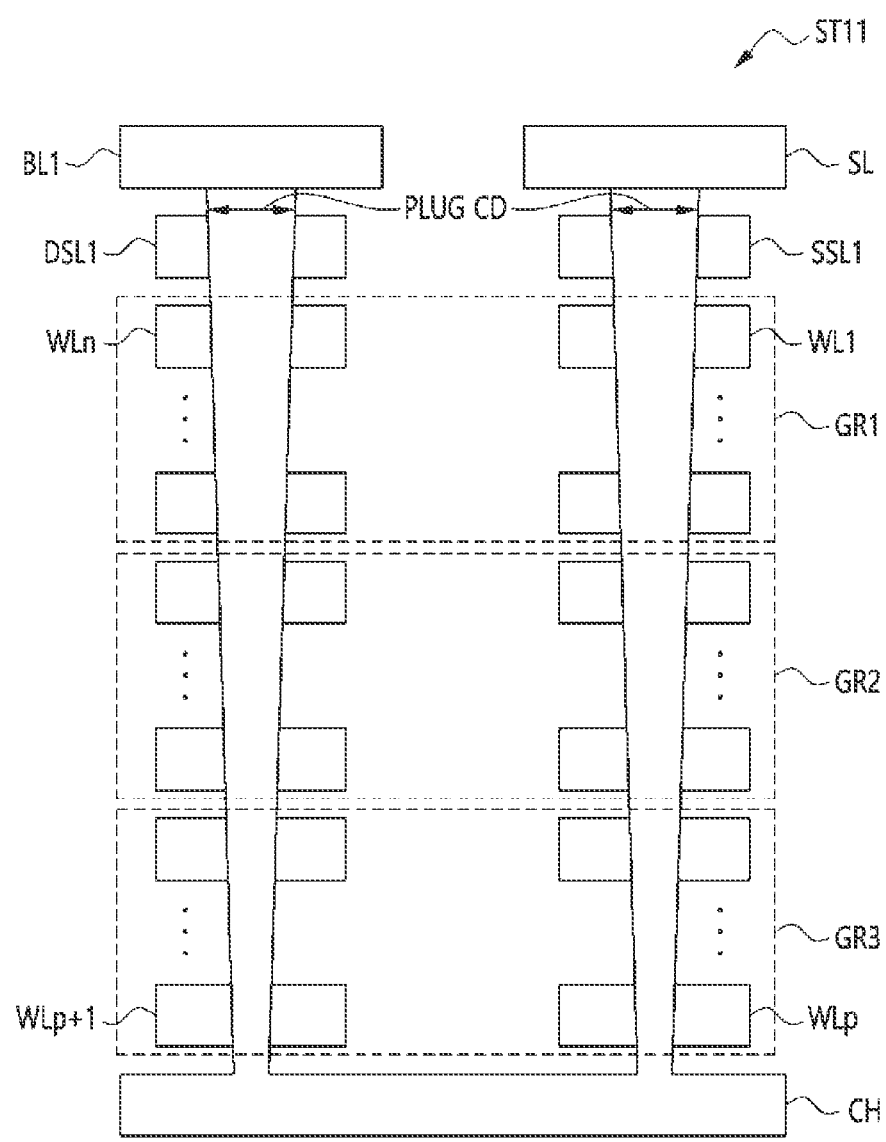
FIG. 4 is a diagram illustrating first to third word line groups coupled to a string according to an embodiment.

FIG. 4 is a diagram illustrating first to third word line groups GR1 to GR3 coupled to the string ST11 according to an embodiment. For example, FIG. 4 illustrates a cross section of the string ST11 of FIG. 3.

Referring to FIG. 4, sizes of plug CDs corresponding to where the stacked word lines WL1 to WLn intersect with the plug CDs may be different from one another. For example, the sizes of the plug CDs may become sequentially smaller from the word line WL1 to the word line WLp. For example, the sizes of the plug CDs may become sequentially smaller from the word line WLn to the word line WLp+1. The sizes of the plug CDs of the word lines intersecting at the same height of a channel, for example, the sizes of the plug CDs of the word line WL1 and the word line WLn may be the same as each other. As the number of the stacked word lines WL1 to WLn becomes greater, difference between the sizes of the plug CDs of the stacked word lines WL1 to WLn may become greater.

Due to the differences in the sizes of the plug CDs, the devices may operate unevenly. For example, when there occurs an electric field between each word line and a channel CH as an erase voltage of a high voltage level is applied to the channel CH while a relatively lower voltage is applied to the word lines WL1 to WLn during an erase operation, the electric fields related to the respective word lines WL1 to WLn may be different due to the difference in the sizes of the plug CDs. For example, the size of the electric field related to the word line WL1, at which the size of the plug CD is relatively greater, may be less than the size of the electric field related to the word line WLp, at which the size of the plug CD is relatively smaller.

Therefore, among the word lines WL1 to WLn, the word lines having similar characteristics of the plug CDs may be grouped into the first to third word line groups GR1 to GR3. For example, the word lines of the first word line group GR1 may have the plug CDs of a greater size than the word lines of the second word line group GR2, and the word lines of the second word line group GR2 may have the plug CDs of a greater size than the word lines of the third word line group GR3. FIG. 4, provides for example, three word line groups GR1 to GR3. However, the embodiments are not limited to only three word line groups and more or less word line groups may be used according to other embodiments. Although FIG. 4 provides for example the string ST11 of the "U" shape as described with reference to FIG. 3, the word lines coupled to the string of the vertical shape as described with reference to FIG. 2 may be grouped in the similar way as described with reference to FIG. 4. The memory device 10 may control each of the first to third word line groups GR1 to GR3 independently. Hereinafter, described will be the independent control on each of the first to third word line groups GR1 to GR3.

Figure 5:
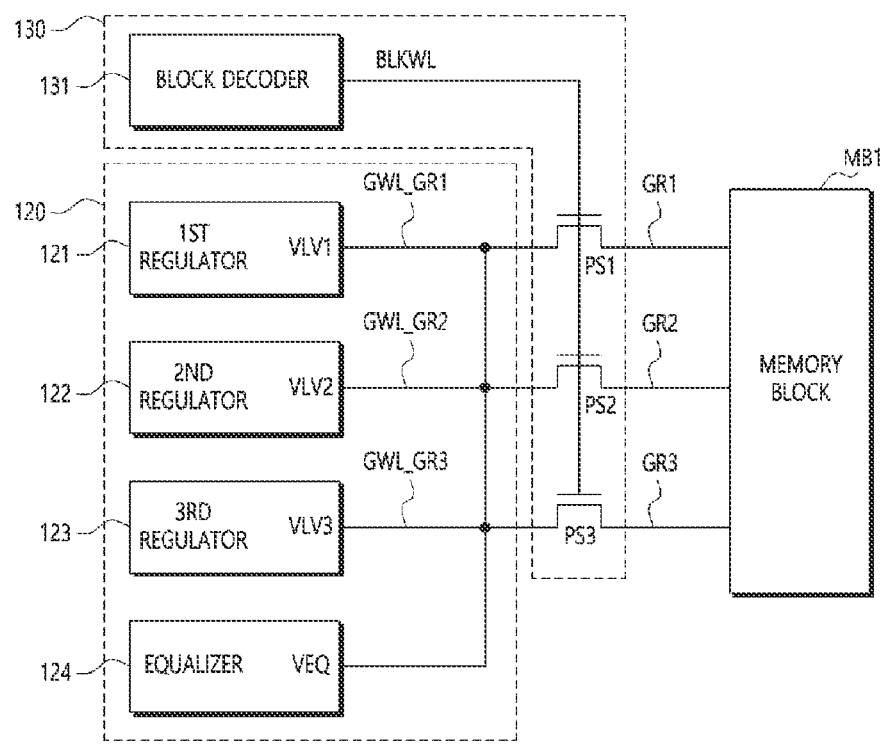
FIG. 5 is a diagram illustrating a peripheral circuit according to an embodiment.

FIG. 5 is a diagram illustrating the peripheral circuit 100 according to an embodiment.

Referring to FIG. 5, the voltage supply circuit 120 may include a first regulator 121, a second regulator 122, a third regulator 123 and an equalizer 124.

The first regulator 121 may be coupled to a first global word line group GWL_GR1. The first global word line group GWL_GR1 may include a plurality of global word lines respectively corresponding to the plurality of word lines included in the first word line group GR1. Under the control of the control logic 110, the first regulator 121 may supply a first word line voltage VLV1 to the first global word line group GWL_GR1. The first global word line group GWL_GR1 may be coupled to the first word line group GR1 of the memory block MB1 through a first pass circuit PS1. Specifically, the plurality of global word lines included in the first global word line group GWL_GR1 may be coupled respectively to the plurality of word lines included in the first word line group GR1 through the first pass circuit PS1.

The second regulator 122 may be coupled to a second global word line group GWL_GR2. The second global word line group GWL_GR2 may include a plurality of global word lines respectively corresponding to the plurality of word lines included in the second word line group GR2. Under the control of the control logic 110, the second regulator 122 may supply a second word line voltage VLV2 to the second global word line group GWL_GR2. The second global word line group GWL_GR2 may be coupled to the second word line group GR2 of the memory block MB1 through a second pass circuit PS2. Specifically, the plurality of global word lines included in the second global word line group GWL_GR2 may be coupled respectively to the plurality of word lines included in the second word line group GR2 through the second pass circuit PS2. The second word line voltage VLV2 may be higher than the first word line voltage VLV1.

The third regulator 123 may be coupled to a third global word line group GWL_GR3. The third global word line group GWL_GR3 may include a plurality of global word lines respectively corresponding to the plurality of word lines included in the third word line group GR3. Under the control of the control logic 110, the third regulator 123 may supply a third word line voltage VLV3 to the third global word line group GWL_GR3. The third global word line group GWL_GR3 may be coupled to the third word line group GR3 of the memory block MB1 through a third pass circuit PS3. Specifically, the plurality of global word lines included in the third global word line group GWL_GR3 may be coupled respectively to the plurality of word lines included in the third word line group GR3 through the third pass circuit PS3. The third word line voltage VLV3 may be higher than the second word line voltage VLV2.

The equalizer 124 may be coupled to the first to third global word line groups GWL_GR1 to GWL_GR3. Under the control of the control logic 110, the equalizer 124 may supply an equalizing voltage VEQ to the first to third global word line groups GWL_GR1 to GWL_GR3. The equalizing voltage VEQ may be higher than the third word line voltage VLV3.

The decoder 130 may include a block decoder 131 and the first to third pass circuits PS1 to PS3.

Under the control of the control logic 110, the block decoder 131 may apply a block selecting signal BLKWL, which corresponds to the memory block MB1, to the first to third pass circuits PS1 to PS3. The block decoder 131 may enable the block selecting signal BLKWL when an erase operation is performed on the memory block MB1.

When the block selecting signal BLKWL is enabled, the first pass circuit PS1 may couple the first global word line group GWL_GR1 to the first word line group GR1, the second pass circuit PS2 may couple the second global word line group GWL_GR2 to the second word line group GR2 and the third pass circuit PS3 may couple the third global word line group GWL_GR3 to the third word line group GR3. Therefore, while the block selecting signal BLKWL stays enabled, the first word line voltage VLV1 may be transferred from the first global word line group GWL_GR1 to the first word line group GR1, the second word line voltage VLV2 may be transferred from the second global word line group GWL_GR2 to the second word line group GR2 and the third word line voltage VLV3 may be transferred from the third global word line group GWL_GR3 to the third word line group GR3. Also, while the block selecting signal BLKWL stays enabled, the equalizing voltage VEQ may be transferred from the first to third global word line groups GWL_GR1 to GWL_GR3 to the first to third word line groups GR1 to GR3, respectively.

Although not illustrated, the decoder 130 may further include pass circuits coupled respectively between the first to third global word line groups GWL_GR1 to GWL_GR3 and the first to third word line groups of a memory block other than the memory block MB1. Therefore, the block decoder 131 may enable, when an erase operation is performed on a target memory block other than the memory block MB1, the block selecting signal BLKWL corresponding to the target memory block. In this case, in response to the enabled block selecting signal BLKWL, the first to third word line groups coupled to the target memory block may be coupled respectively to the first to third global word line groups GWL_GR1 to GWL_GR3 and may be provided with the first to third word line voltages VLV1 to VLV3 and the equalizing voltage VEQ.

Figure 6:
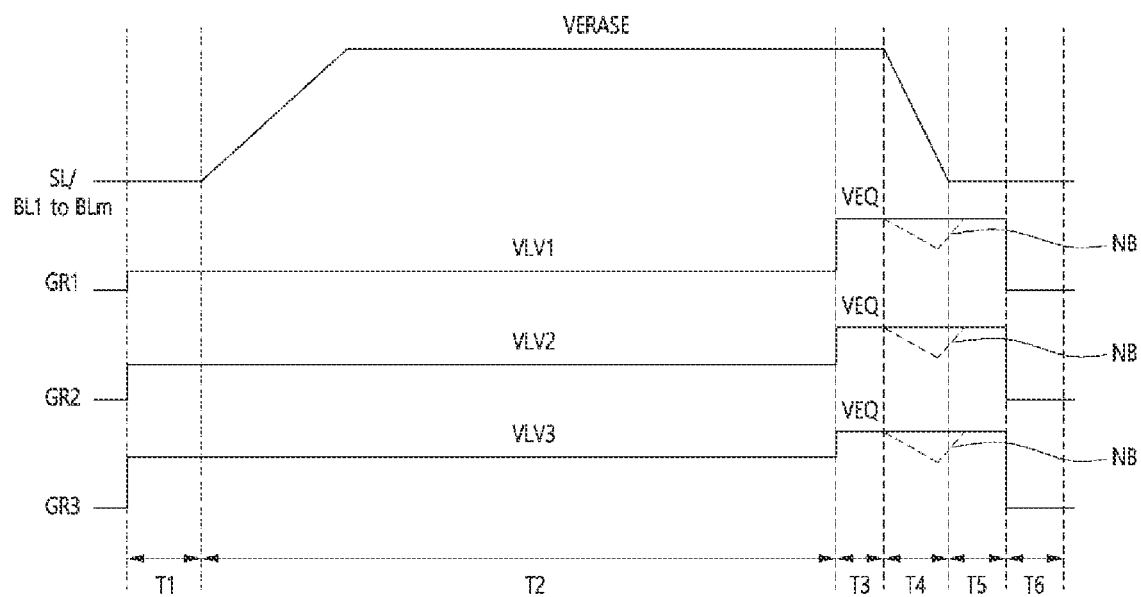
FIG. 6 is a timing diagram illustrating an erase operation performed on a memory block according to an embodiment.

FIG. 6 is a timing diagram illustrating an erase operation performed on the memory block MB1 according to an embodiment.

Referring to FIG. 6, during a section T1 and a section T2, the first to third regulators 121 to 123 may supply the first to third word line voltages VLV1 to VLV3 to the first to third global word line groups GWL_GR1 to GWL_GR3, respectively. In response to the enabled block selecting signal BLKWL, the first to third pass circuits PS1 to PS3 may couple the first to third global word line groups GWL_GR1 to GWL_GR3 to the first to third word line groups GR1 to GR3 of the memory block MB1, respectively. As a result, the first to third word line groups GR1 to GR3 may be provided with the first to third word line voltages VLV1 to VLV3, respectively.

During the section T2, an erase voltage VERASE may be supplied to the source line SL or the bit lines BL1 to BLm coupled to the memory block MB1. As a result, memory cells included in the memory block MB1 may be erased because of voltage difference between the channel CH and each of the word lines WL1 to WLn. The section T2 may be referred to as an erasing section.

Here, the first to third word line voltages VLV1 to VLV3 of different levels may be applied to the first to third word line groups GR1 to GR3, respectively, because the sizes of the electric fields related to the respective word lines WL1 to WLn are different from one another due to the size differences of the plug CDs as described above. In other words, the size of the electric field related to the first word line group GR1 may be smaller than the sizes of the electric fields related to the remaining word line groups or the second word line group GR2 and the third word line group GR3 and therefore the first word line group GR1 may be provided with the first word line voltage VLV1 having the lowest voltage level. Also, the size of the electric field related to the third word line group GR3 may be greater than the sizes of the electric fields related to the remaining word line groups or the first word line group GR1 and the second word line group GR2 and therefore the third word line group GR3 may be provided with the third word line voltage VLV3 having the highest voltage level.

During a section T4, the erase voltage VERASE may be discharged through the source line SL or the bit lines BL1 to BLm. The section T4 may be referred to as an erase voltage discharging section.

From a section T3 to a section T5, the equalizer 124 may provide the equalizing voltage VEQ to the first to third global word line groups GWL_GR1 to GWL_GR3. The section T3 may correspond to a predetermined amount of time immediately before the erase voltage discharging section T4 and the section T5 may correspond to a predetermined amount of time immediately after the erase voltage discharging section T4. In an embodiment, one of the section T3 and the section T5 may be omitted. In response to the enabled block selecting signal BLKWL, the first to third pass circuits PS1 to PS3 may still couple the first to third global word line groups GWL_GR1 to GWL_GR3 to the first to third word line groups GR1 to GR3 and therefore the first to third word line groups GR1 to GR3 may be provided with the equalizing voltage VEQ. The section from the section T3 to the section T5 may be referred to as an equalizing section. The word "predetermined" as used herein with respect to a parameter, such as a predetermined amount of time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

During a section T6, the first to third global word line groups GWL_GR1 to GWL_GR3 and the first to third word line groups GR1 to GR3 may be discharged. The section T6 may be referred to as a word line discharging section.

Figure 7:
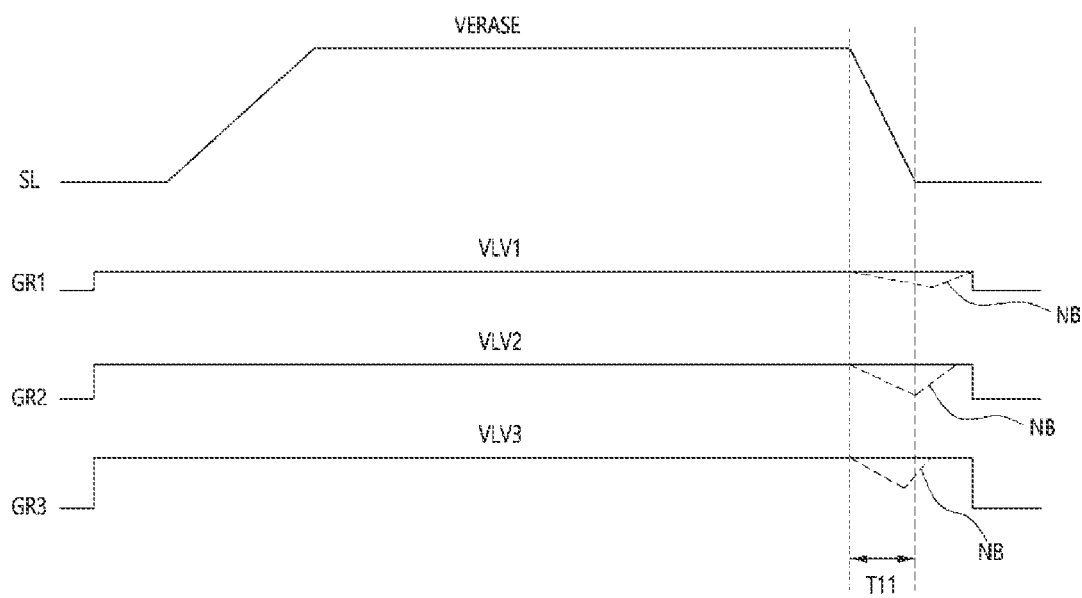
FIG. 7 is a timing diagram illustrating a case that an equalizing voltage is not applied.

FIG. 7 is a timing diagram illustrating a case that the equalizing voltage VEQ is not applied.

Referring to FIG. 7, apart from FIG. 6, there might not be the equalizing section overlapping the erase voltage discharging section T11. That is, during the erase voltage discharging section T11, the equalizing voltage VEQ might not be provided to the first to third word line groups GR1 to GR3 and the first to third word line groups GR1 to GR3 may keep the first to third word line voltages VLV1 to VLV3. In this case, during the erase voltage discharging section T11, negative boosting NB on the word lines WL1 to WLn might occur because of coupling capacitance between the channel CH and the word lines WL1 to WLn. When negative boosting NB on the word lines WL1 to WLn occurs, the voltage levels of the first to third word line groups GR1 to GR3 may temporarily drop and may be recovered, as illustrated in FIG. 7. What is problematic is that the voltage levels and loadings of the first to third word line voltages VLV1 to VLV3 are different from one another and therefore the amounts of the voltage drop and the time amounts for the recovery may be different among the first to third word line voltages VLV1 to VLV3, as illustrated in FIG. 7. As a result, the uneven negative boosting NB may damage the uniformity of characteristics of the memory cells and therefore may cause the data reliability problem.

However, referring back to FIG. 6, the first to third word line groups GR1 to GR3 may be equalized by the equalizing voltage VEQ during the time amount from the section T3 to the section T5 overlapping the erase voltage discharging section T4. As a result, even when negative boosting NB occurs on the first to third word line groups GR1 to GR3, the effect of the negative boosting NB may be uniform on the first to third word line groups GR1 to GR3. That is, as illustrated in FIG. 6, the amounts of the voltage drop and the time amounts for the recovery may be the same on the first to third word line groups GR1 to GR3. Therefore, according to an embodiment, the memory device 10 may provide the equalizing voltage VEQ to the word lines WL1 to WLn during the erase voltage discharging section T4 of the erase operation and thus may control the characteristics of the memory cells to be uniform and may secure the data reliability.

According to an embodiment, a memory device and an operating method of the memory device may control an effect of negative boosting to evenly occur during an erase operation and thus may guarantee reliability thereof.

While certain embodiments have been described above, it will be understood to those skilled in the art that the embodiments described are by way of example only. Accordingly, the memory device and operating method thereof should not be limited based on the described embodiments. Rather, the memory device and operating method thereof described herein should only be limited in light of the claims that follow when taken in conjunction with the above description and accompanying drawings.

What is claimed is:

1. A memory device comprising:
a memory block including a first word line group of word lines included in the memory block and a second word line group of the word lines included in the memory block, the word lines of the first word line group are different from the word lines of the second word line group; and
a peripheral circuit configured to provide the first word line group and the second word line group with an equalizing voltage during an equalizing section overlapping an erase voltage discharging section for the memory block to constantly keep voltages of the first word line group and the second word line group to the equalizing voltage.

2. The memory device of claim 1, wherein the equalizing section includes a section, during which the equalizing voltage is provided, before the erase voltage discharging section.

3. The memory device of claim 1, wherein the equalizing section includes a section, during which the equalizing voltage is provided, after the erase voltage discharging section.

4. The memory device of claim 1, wherein the equalizing section includes sections, during which the equalizing voltage is provided, before and after the erase voltage discharging section.

5. The memory device of claim 1, wherein the peripheral circuit is further configured to provide, during an erasing section immediately before the equalizing section, the first word line group with a first word line voltage and the second word line group with a second word line voltage, which is higher than the first word line voltage and lower than the equalizing voltage.

6. The memory device of claim 1, wherein the peripheral circuit is further configured to discharge the first word line group and the second word line group during a word line discharging section, which is immediately after the equalizing section.

7. The memory device of claim 1, wherein the first word line group and the second word line group have plug critical dimensions of different characteristics from each other.

8. The memory device of claim 1, wherein the peripheral circuit includes:
a first regulator configured to provide a first global word line group with a first word line voltage;
a second regulator configured to provide a second global word line group with a second word line voltage, which is higher than the first word line voltage and lower than the equalizing voltage;
an equalizer configured to provide the first global word line group and the second global word line group with the equalizing voltage; and
a decoder configured to couple the first global word line group and the second global word line group to the first word line group and the second word line group, respectively.

9. A memory device comprising:
a memory block including a first word line group of word lines included in the memory block and a second word line group of the word lines included in the memory block, the word lines of the first word line group are different from the word lines of the second word line group; and
a peripheral circuit configured to provide, during an erase operation on the memory block, the first word line group and the second word line group respectively with a first word line voltage and a second word line voltage and then constantly provide an equalizing voltage during an equalizing section.

10. The memory device of claim 9, wherein the equalizing voltage is higher than each of the first word line voltage and the second word line voltage.

11. The memory device of claim 9, wherein the equalizing section overlaps an erase voltage discharging section.

12. The memory device of claim 11, wherein the equalizing section includes at least one section, during which the equalizing voltage is provided, the at least one section being disposed immediately before, immediately after, or immediately before and after the erase voltage discharging section.

13. The memory device of claim 9, wherein the peripheral circuit provides the first word line group and the second word line group respectively with the first word line voltage and the second word line voltage during an erase section, during which an erase voltage is provided to the memory block.

14. The memory device of claim 9, wherein the peripheral circuit is further configured to discharge the first word line group and the second word line group during a word line discharging section, which is after the equalizing section.

15. The memory device of claim 9, wherein the first word line group and the second word line group have plug critical dimensions of different characteristics from each other.

16. The memory device of claim 9, wherein the peripheral circuit includes:
 a first regulator configured to provide a first global word line group with the first word line voltage;
 a second regulator configured to provide a second global word line group with the second word line voltage;
 an equalizer configured to provide the first global word line group and the second global word line group with the equalizing voltage; and
 a decoder configured to couple the first global word line group and the second global word line group to the first word line group and the second word line group, respectively.

17. An operating method of a memory device, the operating method comprising:
 providing, during an erasing section, a first word line group of a memory block with a first word line voltage and a second word line group of the memory block with a second word line voltage, which is higher than the first word line voltage;
 providing, during an equalizing section after the erasing section, the first word line group and the second word line group with an equalizing voltage, which is higher than the second word line voltage; and
 discharging, during an erase voltage discharging section included in the equalizing section, an erase voltage during the providing of the equalizing voltage.

18. The operating method of claim 17, wherein the equalizing section includes at least one section, during which the equalizing voltage is provided, the at least one section being disposed immediately before, immediately after, or immediately before and after the erase voltage discharging section.

19. The operating method of claim 17, further comprising discharging the first word line group and the second word line group during a word line discharging section, which is after the equalizing section.

20. The operating method of claim 17, wherein the first word line group and the second word line group have plug critical dimensions of different characteristics from each other.

* * * * *